United States Patent
Hoshino (10) Patent No.: US 6,927,576 B2
(45) Date of Patent: Aug. 9, 2005

(54) MAGNETIC RESONANCE SIGNAL ACQUIRING APPARATUS AND MAGNETIC RESONANCE IMAGING APPARATUS

(75) Inventor: Kazuya Hoshino, Tokyo (JP)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 0 days.

(21) Appl. No.: 10/376,760

(22) Filed: Feb. 27, 2003

(65) Prior Publication Data

US 2003/0169043 A1 Sep. 11, 2003

(30) Foreign Application Priority Data

Mar. 6, 2002 (JP) ........................................ 2002-060476

(51) Int. Cl.⁷ ................................................ G01V 3/00
(52) U.S. Cl. ...................................... 324/320; 324/318
(58) Field of Search ................................ 324/320, 318, 324/319, 322, 307, 309, 312, 244, 280; 600/410

(56) References Cited

U.S. PATENT DOCUMENTS

| | | | |
|---|---|---|---|
| 4,644,279 A | 2/1987 | Hoshino et al. | |
| 4,656,426 A | 4/1987 | Yamada et al. | |
| 4,684,889 A | 8/1987 | Yamaguchi et al. | |
| 4,694,251 A | 9/1987 | Yoshitome et al. | |
| 4,713,614 A | 12/1987 | Hoshino et al. | |
| 4,716,368 A | 12/1987 | Haacke | |
| 4,761,613 A | 8/1988 | Hinks | |
| 4,786,871 A | 11/1988 | Hoshino | |
| 4,786,872 A | 11/1988 | Hoshino | |
| 4,894,616 A | 1/1990 | Yoshitome et al. | |
| 4,916,396 A | 4/1990 | Hoshino | |
| 4,982,159 A | 1/1991 | Hoshino | |
| 5,424,646 A | 6/1995 | Hoshino | |
| 5,977,769 A | 11/1999 | Bornert et al. | |
| 6,011,396 A | 1/2000 | Eckels et al. | |
| 6,037,775 A * | 3/2000 | Shenoy et al. | 324/320 |
| 6,275,721 B1 * | 8/2001 | Darrow et al. | 600/410 |
| 6,297,636 B1 | 10/2001 | Shimo et al. | |
| 6,307,370 B1 | 10/2001 | Schauwecker et al. | |
| 6,369,464 B1 | 4/2002 | Schauwecker et al. | |
| 6,433,543 B1 * | 8/2002 | Shahinpoor et al. | 324/244.1 |
| 6,476,700 B2 | 11/2002 | Schauwecker et al. | |

FOREIGN PATENT DOCUMENTS

JP            10277004 A         10/1998

OTHER PUBLICATIONS

Search Report, 16NM–132465/9260, 03251292.3–2209–, 3 pp.
Office Action 16NM01226, 331972, 2002–060476, 2 pp.

* cited by examiner

Primary Examiner—Brij B. Shrivastav
(74) Attorney, Agent, or Firm—Carl B. Horton Esq.

(57) ABSTRACT

For the purpose of acquiring magnetic resonance signals unaffected by any high magnetic field disturbance, magnetic resonance signals are sequentially acquired for a plurality of views; magnetic field disturbance is monitored; the magnetic resonance signal acquisition is repeated for a view at which magnetic field disturbance has occurred; and an image is produced based on magnetic resonance signals after the repetition has been applied.

11 Claims, 10 Drawing Sheets

MAGNETIC RESONANCE SIGNAL ACQUIRING APPARATUS AND MAGNETIC RESONANCE IMAGING APPARATUS

This application claims the benefit of Japanese Application No. 2002-060476 filed Mar. 6, 2002.

BACKGROUND OF THE INVENTION

The present invention relates to a magnetic resonance signal acquiring apparatus and magnetic resonance imaging apparatus, and more particularly to an apparatus for sequentially acquiring magnetic resonance signals for a plurality of views, and an apparatus for producing an image based on the thus-acquired magnetic resonance signals.

In a magnetic resonance imaging (MRI) apparatus, a subject to be imaged is carried into an internal space of a magnet system, i.e., an imaging space in which a static magnetic field is generated, a gradient magnetic field and a high frequency magnetic field are applied to excite spins within the subject to thereby generate magnetic resonance signals, and an image is reconstructed based on the received magnetic resonance signals.

If the installation site of the magnet system is near an electric railroad or the like, passage of an electric train causes magnetic field disturbance. Since the quality of the reconstructed image is degraded if the magnetic resonance signals are affected by the magnetic field disturbance, measures are taken for reducing the effect of the magnetic field disturbance.

One of such measure is to employ a magnetic field generating apparatus for canceling the magnetic field disturbance. This apparatus comprises a magnetic field sensor and a magnetic field generating coil, and is configured to generate a magnetic field by the magnetic field generating coil corresponding to the magnetic field disturbance detected by the magnetic field sensor for canceling the magnetic field disturbance.

The magnetic field generating coil employed is a Helmholtz coil. Three Helmholtz coils each having a coil axis perpendicular to one another are employed to allow magnetic fields in three mutually perpendicular directions to be generated. Six coil loops in the three Helmholtz coils are disposed respectively on six surfaces of a scan room, i.e., on the ceiling, floor, and four lateral walls. Each coil loop has an electric path along the periphery of each surface.

Another measure involves arithmetically calculating the effect of the magnetic field disturbance on the magnetic resonance signals, and correcting the magnetic resonance signals accordingly. Magnetic resonance signals for use in calculating the effect of the magnetic field disturbance are collected separately from those for image reconstruction. The number of repetitions of the signal collection is set so that the disturbance can be detected at a desired temporal resolution.

When the magnetic field generating apparatus for canceling magnetic field disturbance is employed, special construction work is needed to install the apparatus in the scan room. When the effect of magnetic field disturbance is arithmetically calculated from magnetic resonance signals, magnetic resonance signals for use in the calculation must be collected separately from those for image reconstruction a specified number of times, regardless of whether magnetic field disturbance is present. Moreover, the magnitude of magnetic field disturbance that can be canceled or corrected is limited regardless of which technique is employed.

SUMMARY OF THE INVENTION

It is therefore an object of the present invention is to provide an apparatus for acquiring magnetic resonance signals unaffected by any high magnetic field disturbance, and an apparatus for conducting magnetic resonance imaging based on the thus-acquired magnetic resonance signals.

(1) The present invention, in accordance with one aspect thereof for solving the aforementioned problems, is a magnetic resonance signal acquiring apparatus characterized in comprising: signal acquiring means for sequentially acquiring magnetic resonance signals for a plurality of views; monitoring means for monitoring magnetic field disturbance; and control means for causing said signal acquiring means to repeat the magnetic resonance signal acquisition for a view at which magnetic field disturbance has occurred.

(2) The present invention, in accordance with another aspect thereof for solving the aforementioned problems, may be a magnetic resonance signal acquiring method characterized in comprising the steps of: sequentially acquiring magnetic resonance signals for a plurality of views; monitoring magnetic field disturbance; and repeating the magnetic resonance signal acquisition for a view at which magnetic field disturbance has occurred.

In the invention of the aspects described in (1) and (2), magnetic resonance signals are sequentially acquired for a plurality of views, magnetic field disturbance is monitored, and the magnetic resonance signal acquisition is repeated for a view at which magnetic field disturbance has occurred; and therefore, magnetic resonance signals unaffected by any high magnetic field disturbance can be acquired.

(3) The present invention, in accordance with still another aspect thereof for solving the aforementioned problems, is a magnetic resonance imaging apparatus characterized in comprising: signal acquiring means for sequentially acquiring magnetic resonance signals for a plurality of views; monitoring means for monitoring magnetic field disturbance; control means for causing said signal acquiring means to repeat the magnetic resonance signal acquisition for a view at which magnetic field disturbance has occurred; and image producing means for producing an image based on magnetic resonance signals after said repetition has been applied.

(4) The present invention, in accordance with still another aspect thereof for solving the aforementioned problems, may be a magnetic resonance imaging method characterized in comprising the steps of: sequentially acquiring magnetic resonance signals for a plurality of views; monitoring magnetic field disturbance; repeating the magnetic resonance signal acquisition for a view at which magnetic field disturbance has occurred; and producing an image based on magnetic resonance signals after said repetition has been applied.

In the invention of the aspects described in (3) and (4), magnetic resonance signals are sequentially acquired for a plurality of views, magnetic field disturbance is monitored, the magnetic resonance signal acquisition is repeated for a view at which magnetic field disturbance has occurred, and an image is produced based on magnetic resonance signals after the repetition has been applied; and therefore, magnetic resonance signals unaffected by any high magnetic field disturbance can be acquired, and an image of good quality is obtained based on the magnetic resonance signals.

The repetition is preferably conducted when the variation of said magnetic field exceeds a predefined threshold, so that the number of repetitions is optimized.

The threshold is preferably varied with the amount of phase encoding on said magnetic resonance signals, so that the number of repetitions is optimized using the difference of an effect of the amount of phase encoding.

The threshold is preferably larger for a larger amount of phase encoding, so that the number of repetitions is reduced.

The threshold is preferably varied with the frequency of the variation of said magnetic field, so that the number of repetitions is optimized using the difference of an effect of the frequency.

The threshold is preferably larger for a larger difference between said frequency and the reciprocal of an echo time TE of said magnetic resonance signals, so that the number of repetitions is reduced.

Therefore, the present invention can provide an apparatus for acquiring magnetic resonance signals unaffected by any high magnetic field disturbance, and an apparatus for conducting magnetic resonance imaging based on the thus-acquired magnetic resonance signals.

Further objects and advantages of the present invention will be apparent from the following description of the preferred embodiments of the invention as illustrated in the accompanying drawings.

DETAILED DESCRIPTION OF THE INVENTION

Figure 1:
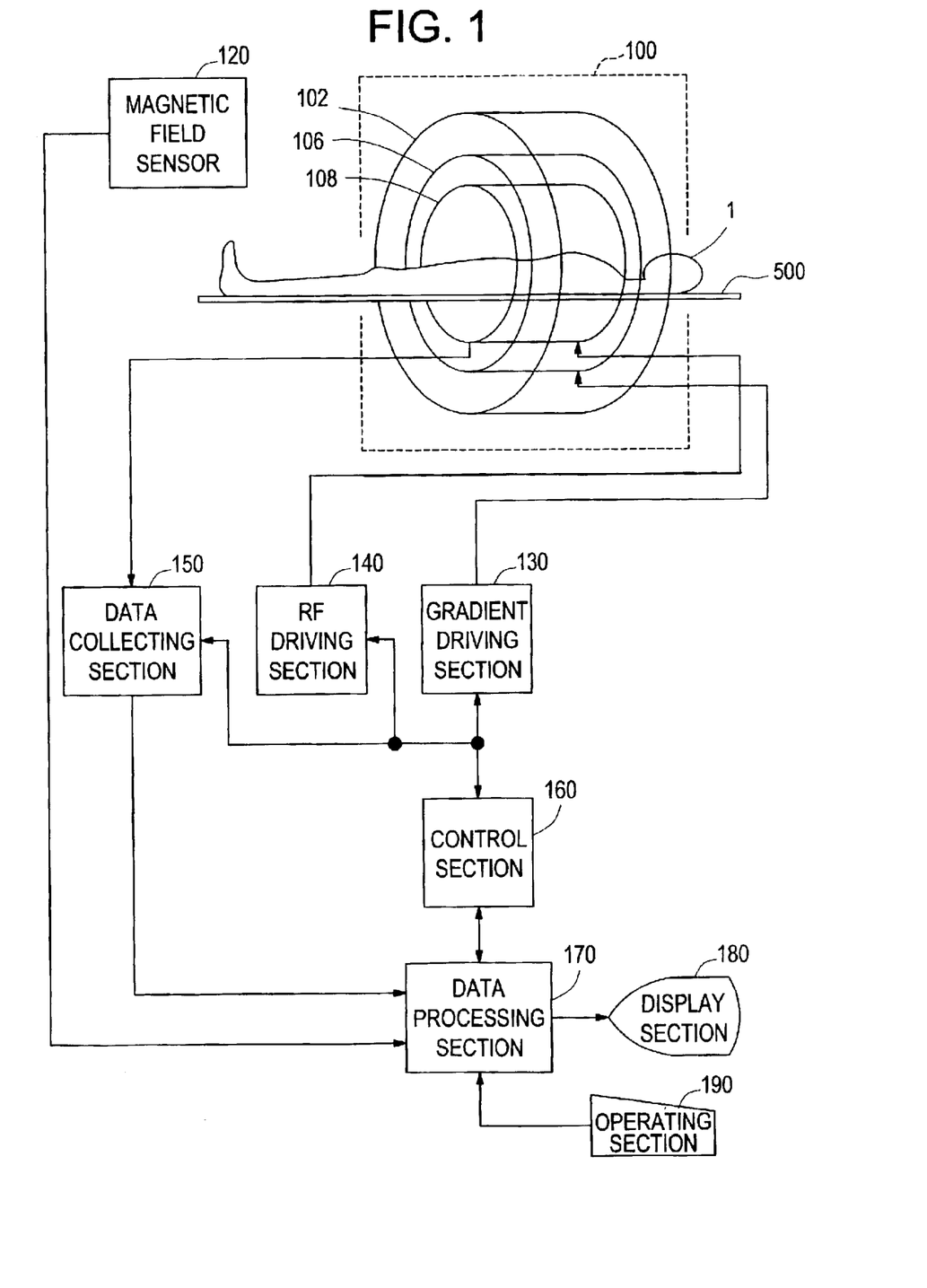
FIG. 1 is a block diagram of an apparatus in accordance with one embodiment of the present invention.

Embodiments of the present invention will now be described in detail with reference to the accompanying drawings. FIG. 1 shows a block diagram of a magnetic resonance imaging apparatus, which is an embodiment of the present invention. The configuration of the apparatus represents an embodiment of the apparatus in accordance with the present invention. The operation of the apparatus represents an embodiment of the method in accordance with the present invention.

As shown in FIG. 1, the present apparatus has a magnet system 100, which is installed in a scan room. The magnet system 100 has a main magnetic field coil section 102, a gradient coil section 106, and an RF coil section 108. These coil sections have a generally cylindrical shape and are concentrically disposed. A subject to be imaged 1 is rested on a cradle 500 and carried into and out of a generally cylindrical internal space (bore) of the magnet system 100 by carrier means, which is not shown.

The main magnetic field coil section 102 generates a static magnetic field in the internal space of the magnet system 100. The direction of the static magnetic field is generally in parallel with the direction of the body axis of the subject 1. That is, a magnetic field generally referred to as a horizontal magnetic field is generated. The main magnetic field coil section 102 is made using a superconductive coil, for example. It will be easily recognized that the main magnetic field coil section 102 is not limited to the superconductive coil, but may be made using a normal conductive coil or the like.

The gradient coil section 106 generates three gradient magnetic fields for imparting gradients to the static magnetic field strength in directions of three mutually perpendicular axes, i.e., a slice axis, a phase axis, and a frequency axis.

When mutually perpendicular coordinate axes in the static magnetic field space are represented as x, y, and z, any one of the axes can be the slice axis. In this case, one of the two remaining axes is the phase axis and the other is the frequency axis. Moreover, the slice, phase, and frequency axes can be given arbitrary inclination with respect to the x-, y-, and z-axes while maintaining their mutual perpendicularity. In the present apparatus, the direction of the body axis of the subject 1 is defined as the z-axis direction.

The gradient magnetic field in the slice axis direction is sometimes referred to as the slice gradient magnetic field. The gradient magnetic field in the phase axis direction is sometimes referred to as the phase encoding gradient magnetic field. The gradient magnetic field in the frequency axis direction is sometimes referred to as the readout gradient magnetic field. In order to enable generation of such gradient magnetic fields, the gradient coil section 106 has three gradient coils, which are not shown. The gradient magnetic field will be sometimes referred to simply as the gradient hereinbelow.

The RF coil section 108 generates a high frequency magnetic field for exciting spins within the subject 1 in the static magnetic field space. The generation of the high frequency magnetic field will be sometimes referred to as transmission of an RF excitation signal hereinbelow. Moreover, the RF excitation signal will be sometimes referred to as the RF pulse. The RF coil section 108 also receives electromagnetic waves, i.e., magnetic resonance signals, generated by the excited spins.

The RF coil section 108 has transmitting and receiving coils, which are not shown. For the transmitting and receiving coils, the same coil or separate dedicated coils may be used.

The gradient coil section 106 is connected with a gradient driving section 130. The gradient driving section 130 supplies driving signals to the gradient coil section 106 to generate the gradient magnetic fields. The gradient driving section 130 has three driving circuits, which are not shown, corresponding to the three gradient coils in the gradient coil section 106.

The RF coil section 108 is connected with an RF driving section 140. The RF driving section 140 supplies driving signals to the RF coil section 108 to transmit the RF pulse, thereby exciting the spins within the subject 1.

The RF coil section 108 is also connected with a data collecting section 150. The data collecting section 150 gathers receive signals received by the RF coil section 108, and collects the signals as digital data.

The gradient driving section 130, RF driving section 140 and data collecting section 150 are connected with a control section 160. The control section 160 controls the gradient driving section 130, RF driving section 140 and data collecting section 150 to carry out collection of the magnetic resonance signals. A portion including the magnet system 100, gradient driving section 130, RF driving section 140, data collecting section 150, and control section 160 is one embodiment of the sianal acquiring means of the present invention.

The control section 160 is, for example, constituted using a computer. The control section 160 has a memory, which is not shown. The memory stores programs for the control section 160 and several kinds of data. The function of the control section 160 is implemented by the computer executing a program stored in the memory.

The output of the data collecting section 150 is connected to a data processing section 170. Data collected by the data collecting section 150 is input to the data processing section 170. The data processing section 170 is also supplied with an output signal, i.e., a magnetic field detection signal, from a magnetic field sensor 120. The magnetic field sensor 120 is installed at an appropriate location in the scan room. The installation site of the magnetic field sensor 120 is selected so that magnetic field disturbance can be effectively detected.

The data processing section 170 is, for example, constituted using a computer. The data processing section 170 has a memory, which is not shown. The memory stores programs for the data processing section 170 and several kinds of data.

The data processing section 170 is connected to the control section 160. The data processing section 170 is above the control section 160 and controls it. The function of the present apparatus is implemented by the data processing section 170 executing a program stored in the memory.

The data processing section 170 stores the data collected by the data collecting section 150 into the memory. A data space is established in the memory. The data space constitutes a two-dimensional Fourier space. The two-dimensional Fourier space will be sometimes referred to as a k-space hereinbelow. The data processing section 170 performs a two-dimensional inverse Fourier transformation on the data in the k-space to reconstruct an image of the subject 1. The data processing section 170 is one embodiment of the image producing means of the present invention.

The magnetic field detection signal from the magnetic field sensor 120 is also stored in the memory. The data processing section 170 monitors magnetic field disturbance using the magnetic field detection signal stored in the memory. A portion including the magnetic field sensor 120 and data processing section 170 is one embodiment of the monitoring means of the present invention.

The data processing section 170 is connected with a display section 180 and an operating section 190. The display section 180 comprises a graphic display, etc. The operating section 190 comprises a keyboard, etc., provided with a pointing device.

The display section 180 displays the reconstructed image and several kinds of information output from the data processing section 170. The operating section 190 is operated by a user, and the section 190 inputs several commands, information and so forth to the data processing section 170. The user interactively operates the present apparatus via the display section 180 and operating section 190.

Figure 2:
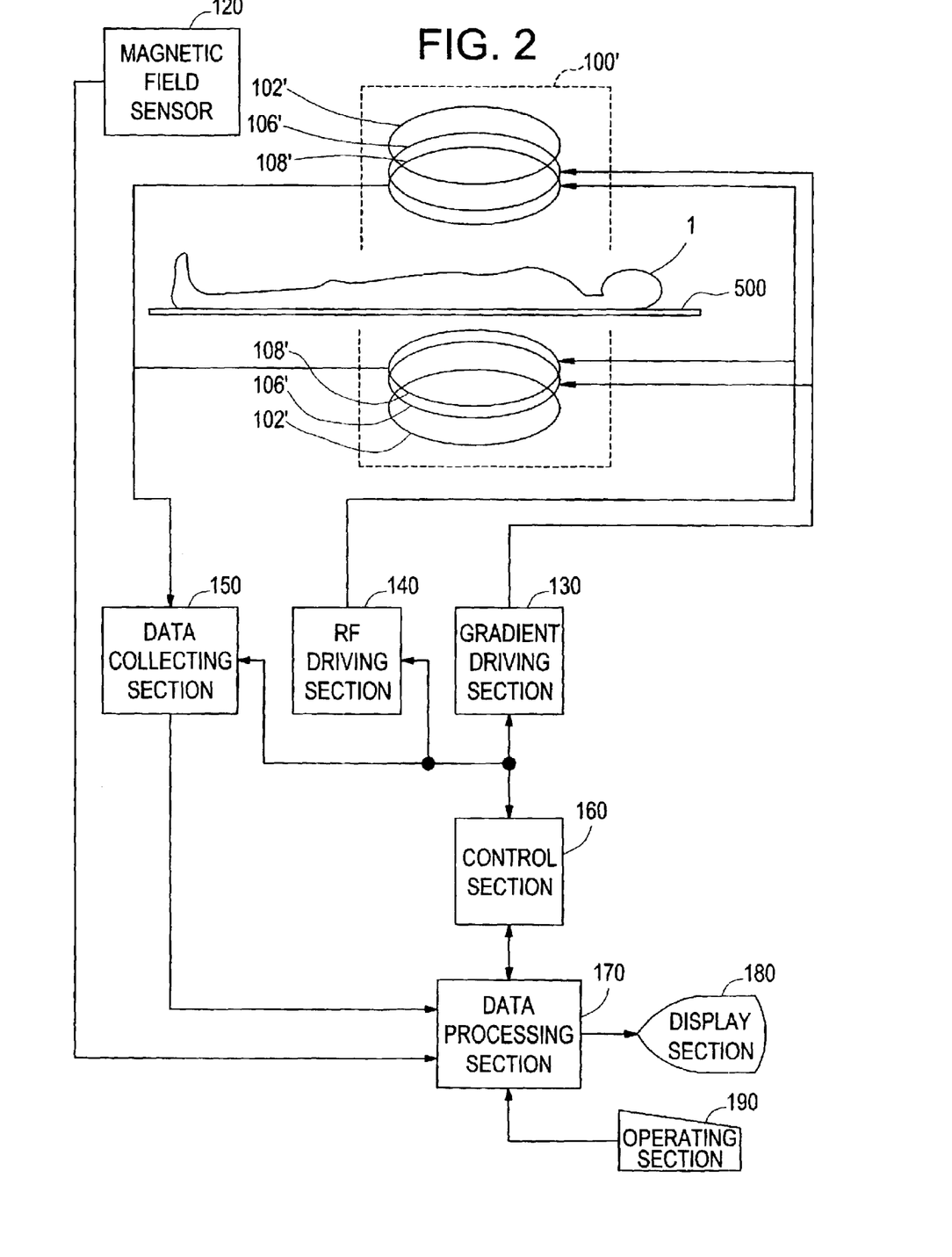
FIG. 2 is a block diagram of an apparatus in accordance with one embodiment of the present invention.

FIG. 2 shows a block diagram of a magnetic resonance imaging apparatus of another type, which is one embodiment of the present invention. The configuration of the apparatus represents an embodiment of the apparatus in accordance with the present invention. The operation of the apparatus represents an embodiment of the method in accordance with the present invention.

The present apparatus has a magnet system 100' of a type different from that of the apparatus shown in FIG. 1. The magnet system 100' is installed in a scan room. Since the apparatus has a configuration similar to that of the apparatus shown in FIG. 1 except for the magnet system 100', similar portions are designated by similar reference numerals and the explanation thereof will be omitted.

The magnet system 100' has a main magnetic field magnet section 102', a gradient coil section 106', and an RF coil section 108'. The main magnetic field magnet section 102' and the coil sections each include a pair of members facing each other across a space. These sections have a generally disk-like shape and are disposed to have a common center axis. A subject 1 is rested on a cradle 500 and carried into and out of an internal space (bore) of the magnet system 100' by carrier means, which is not shown.

The main magnetic field magnet section 102' generates a static magnetic field in the internal space of the magnet system 100'. The direction of the static magnetic field is generally orthogonal to the direction of the body axis of the subject 1. That is, a magnetic field generally referred to as a vertical magnetic field is generated. The main magnetic field magnet section 102' is made using a permanent magnet, for example. It will be easily recognized that the main magnetic field magnet section 102' is not limited to a permanent magnet, but may be made using a super or normal conductive electromagnet or the like.

The gradient coil section 106' generates three gradient magnetic fields for imparting gradients to the static magnetic field strength in directions of three mutually perpendicular axes, i.e., a slice axis, a phase axis and a frequency axis.

When mutually perpendicular coordinate axes in the static magnetic field space are represented as x, y, and z, any one of the axes can be the slice axis. In this case, one of the two remaining axes is the phase axis and the other is the frequency axis. Moreover, the slice, phase, and frequency axes can be given arbitrary inclination with respect to the x-, y-, and z-axes while maintaining their mutual perpendicularity. In the present apparatus, the direction of the body axis of the subject 1 is again defined as the z-axis direction.

The gradient magnetic field in the slice axis direction is sometimes referred to as the slice gradient magnetic field. The gradient magnetic field in the phase axis direction is sometimes referred to as the phase encoding gradient magnetic field. The gradient magnetic field in the frequency axis direction is sometimes referred to as the readout gradient magnetic field. In order to enable generation of such gradient magnetic fields, the gradient coil section 106' has three gradient coils, which are not shown.

The RF coil section 108' transmits an RF pulse for exciting spins within the subject 1 in the static magnetic field space. The RF coil section 108' also receives magnetic resonance signals generated by the excited spins., The RF coil section 108' has transmitting and receiving coils, which are not shown. For the transmitting and receiving coils, the same coil or separate dedicated coils may be used. A portion including the magnet system 100, gradient driving section 130, RF driving section 140, data collecting section 150, and control section 160 is one embodiment of the signal acquiring means of the present invention.

Figure 3:
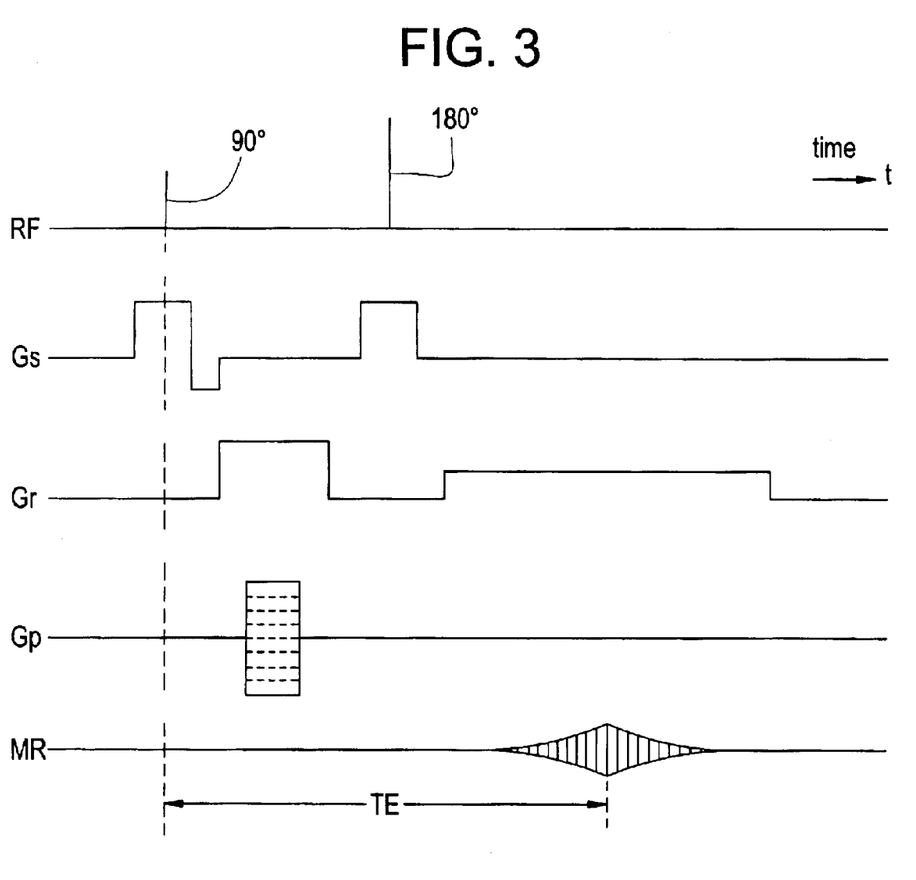
FIG. 3 is a diagram showing an exemplary pulse sequence executed by the apparatus in accordance with one embodiment of the present invention.

FIG. 3 shows an exemplary pulse sequence for use in magnetic resonance imaging. The pulse sequence is one according to a spin echo (SE) technique.

Specifically, (1) is a sequence of 90° and 180° pulses for RF excitation of the SE technique; and (2), (3), (4), and (5) are sequences of a slice gradient Gs, readout gradient Gr, phase encoding gradient Gp, and spin echo MR, respectively, of the SE technique. The 90° and 180° pulses are represented by their respective center signals. The pulse sequence proceeds along a time axis t from the left to the right.

As shown, a 90° pulse achieves 90° excitation of the spins. At this time, the slice gradient Gs is applied to perform selective excitation of a certain slice. After a predetermined time from the 90° excitation, a 180° pulse achieves 180° excitation, i.e., spin inversion. Also at this time, the slice gradient Gs is applied to perform selective excitation of the same slice.

In the period between the 90° excitation and spin inversion, the readout gradient Gr and phase encoding gradient Gp are applied. The readout gradient Gr dephases the spins. The phase encoding gradient Gp phase-encodes the spins.

After the spin inversion, the spins are rephased by the readout gradient Gr to generate a spin echo MR. The spin echo MR is one embodiment of the magnetic resonance signals of the present invention. The spin echo MR is an RF signal having a waveform symmetrical with respect to an echo center. The central echo occurs after TE (echo time) from the 90° excitation. TE is sometimes referred to as an echo time. The spin echo MR is collected by the data collecting section 150 as view data.

Such a pulse sequence is repeated 64–512 times in a cycle TR (repetition time). The phase encoding gradient Gp is changed for each repetition to provide different phase encoding each time. Thus, view data are obtained for 64–512 views having different amounts of phase encoding.

Figure 4:
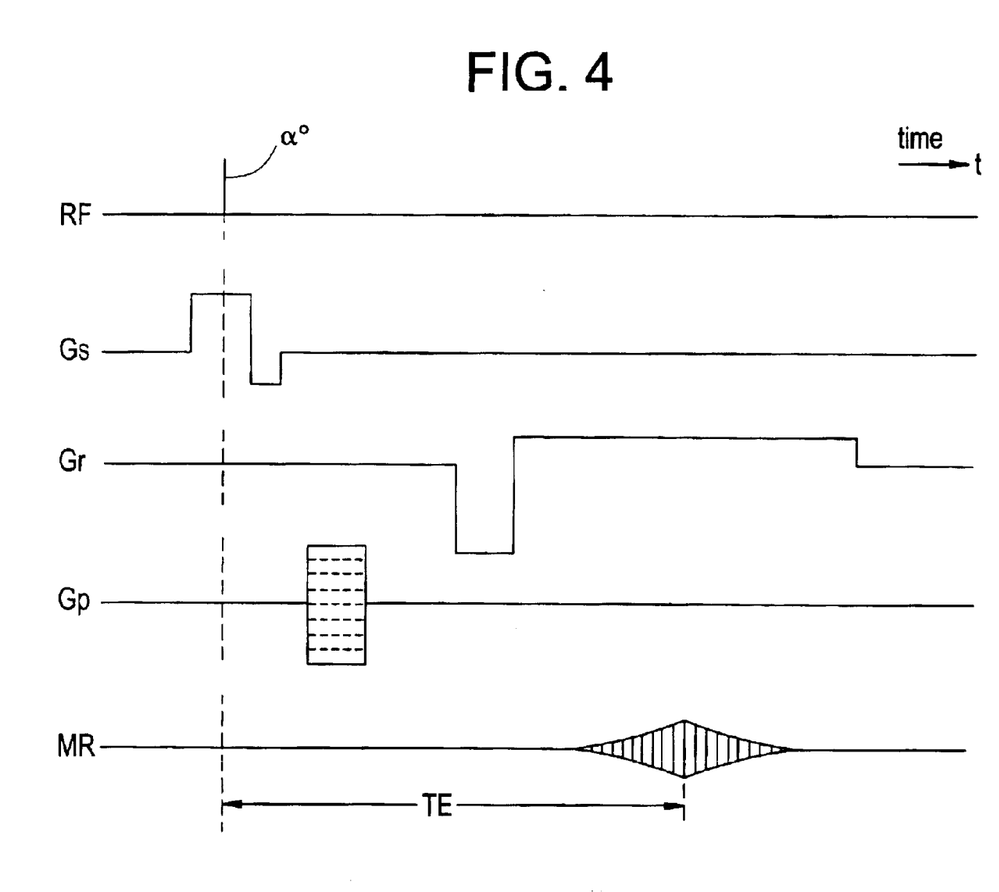
FIG. 4 is a diagram showing an exemplary pulse sequence executed by the apparatus in accordance with one embodiment of the present invention.

Another example of the pulse sequence for magnetic resonance imaging is shown in FIG. 4. This pulse sequence is one according to a gradient echo (GRE) technique.

Specifically, (1) is a sequence of an α° pulse for RF excitation of the GRE technique; and (2), (3), (4), and (5) are sequences of a slice gradient Gs, readout gradient Gr, phase encoding gradient Gp, and spin echo MR, respectively, of the GRE technique. It should be noted that the α° pulse is represented by its central signal. The pulse sequence proceeds along a time axis t from the left to the right.

As shown, the α° pulse achieves α° excitation of the spins, wherein α is not greater than 90. At the same time, the slice gradient Gs is applied to achieve selective excitation for a certain slice.

After the α° excitation, the spins are phase-encoded by the phase encoding gradient Gp. Next, the spins are first dephased and are subsequently rephased by the readout gradient Gr to generate a gradient echo MR. The gradient echo MR is one embodiment of the magnetic resonance signals of the present invention. The gradient echo MR is an RF signal having a waveform symmetrical with respect to an echo center. The central echo occurs after TE from the α° excitation. The gradient echo MR is collected by the data collecting section 150 as view data.

Such a pulse sequence is repeated 64–512 times in a cycle of TR. The phase encoding gradient Gp is changed for each repetition to provide different phase encoding each time. Thus, view data are obtained for 64–512 views having different amounts of phase encoding.

The view data obtained by the pulse sequence of FIG. 3 or 4 are collected into the memory in the data processing section 170. It will be easily recognized that the pulse sequence is not limited to that of the SE or GRE technique, but may be of any other appropriate technique such as a fast spin echo (FSE) technique or an echo planar imaging (EPI) technique.

Figure 5:
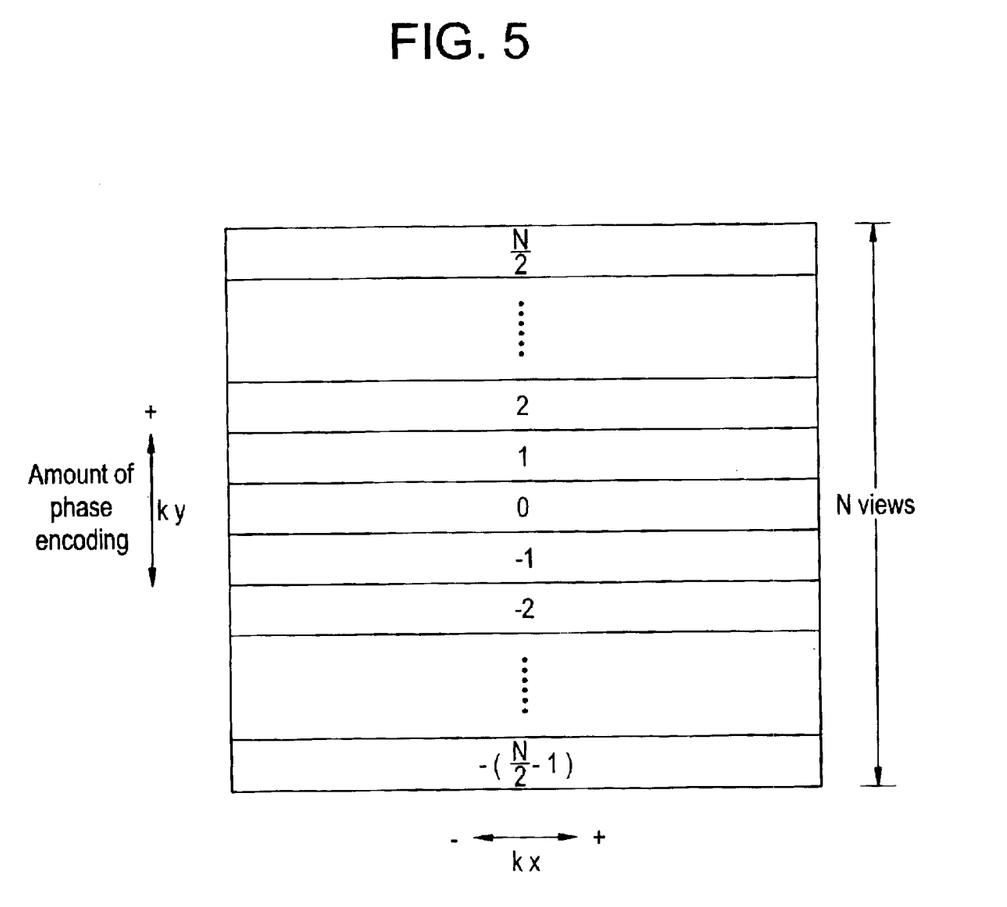
FIG. 5 is a conceptional diagram of a k-space.

FIG. 5 shows a conceptional diagram of a k-space, in which a horizontal axis kx designates a frequency axis, and a vertical axis ky designates a phase axis. In FIG. 5, a plurality of horizontally elongated rectangles represent respective view data. The view data will be sometimes referred to as MR data hereinbelow. The number marked in each rectangle represents the amount of phase encoding. The amount of phase encoding is normalized by π/N. N is 64–512. The amount of phase encoding is zero at the center of the phase axis ky. The amount of phase encoding gradually increases from the center to both ends. The increases are opposite in polarity. The data processing section 170 performs a two-dimensional inverse Fourier transformation on such view data to reconstruct a cross-sectional image of the subject 1. The reconstructed image is stored in the memory.

Figure 6:
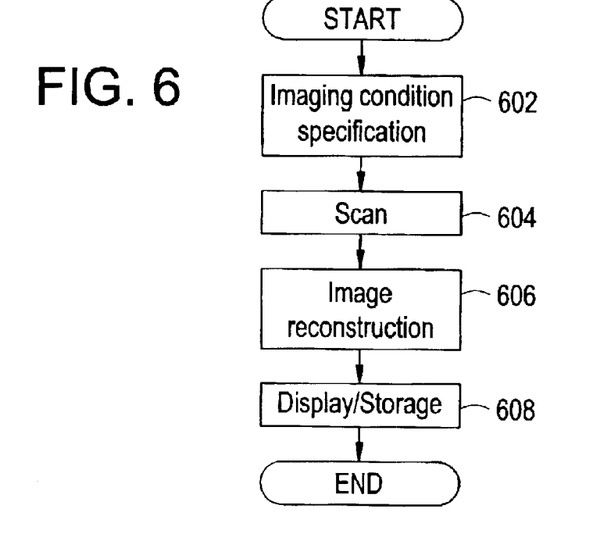
FIG. 6 is a flow chart of an operation of the apparatus in accordance with one embodiment of the present invention.

FIG. 6 shows a flow chart of the operation of the present apparatus. As shown, setting of imaging conditions is conducted at Step 602. The setting of imaging conditions is executed via the operating section 190 by a user. Thus, desired imaging conditions including scan parameters are established.

At Step 604, a scan is next conducted. The scan is achieved by executing the aforementioned pulse sequence under control of the control section 160, and MR data is sequentially acquired for each view.

Figure 7:
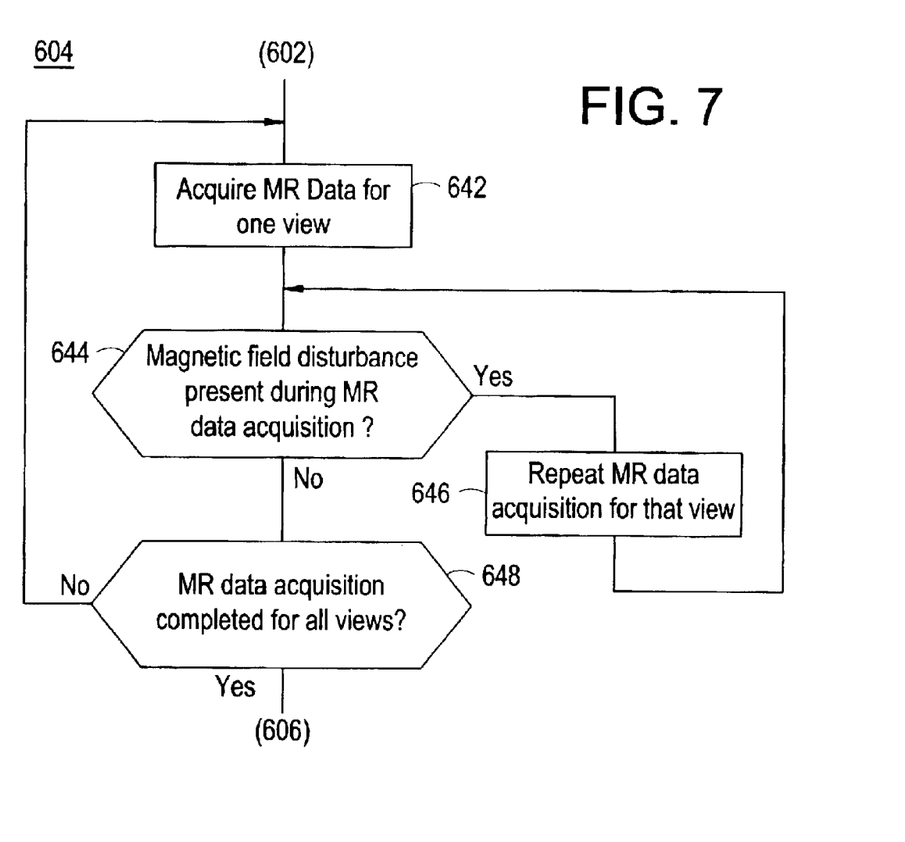
FIG. 7 is a flow chart of an operation of the apparatus in accordance with one embodiment of the present invention.

Exemplary steps in the scan at Step 604 are shown in FIG. 7 in more detail. As shown, when MR data acquisition is conducted for one view at Step 642, a decision is made as to whether magnetic field disturbance was present during the MR data acquisition at the next Step 644. The decision on the presence of magnetic field disturbance is made based on the magnetic field detection signal stored in the memory by the data processing section 170. That is, if the magnetic field detection signal varies beyond a predefined threshold, magnetic field disturbance is decided to be present. The threshold is an appropriate value of the order of 0.5–1 mG (milligauss), for example.

When magnetic field disturbance is decided to be present, repetition of the MR data acquisition for that view is conducted at Step 646. It should be noted that when MR data for a plurality of views are acquired in 1TR, as is the case with the fast spin echo technique and the echo planar imaging technique, for example, the MR data acquisition for the plurality of views are repeated. The same applies in the following description.

The repetition of the MR data acquisition is conducted under control of the control section 160 based on instructions by the data processing section 170. A portion including the data processing section 170 and control section 160 is one embodiment of the control means of the present invention.

Then, at Step 644, a decision is made as to whether magnetic field disturbance was present during the MR data acquisition in this repetition. If magnetic field disturbance is decided to be present, repetition of the MR data acquisition for that view is again conducted for that view at Step 646. The reacquisition of the MR data is thus repeated for the same view while magnetic field disturbance is continuously present.

When magnetic field disturbance is decided not to be present at Step 644, a decision is made as to whether the MR data acquisition has been completed for all views at Step 648, and if it has not, MR data acquisition is conducted for a next view, returning to Step 642.

Thereafter, MR data acquisition is sequentially conducted for every view as described above. By such a scan, MR data for all views are unaffected by any high magnetic field disturbance.

After the MR data acquisition for all views, the data processing section 170 conducts image reconstruction at Step 606. Since the MR data for all the views are unaffected by any magnetic field disturbance, the reconstructed image has a good quality. Such an image is displayed on the display section 180 and stored in the memory at Step 608.

Figure 8:
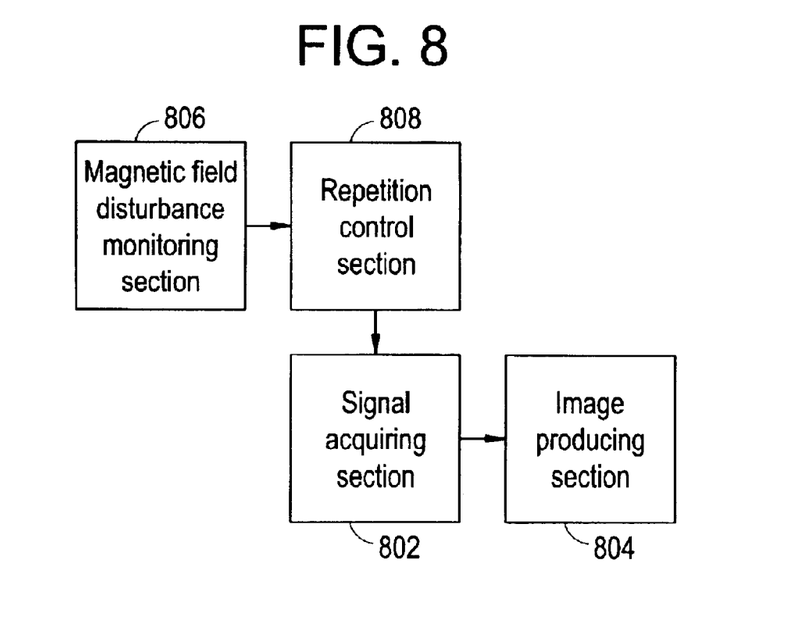
FIG. 8 is a functional block diagram of the apparatus in accordance with one embodiment of the present invention.

FIG. 8 shows a functional block diagram focusing on the aforementioned function. As shown, the present apparatus has a signal acquiring section 802, an image producing section 804, a magnetic field disturbance monitoring section 806, and a repetition control section 808. These sections are respective embodiments of the signal acquiring means, image producing means, monitoring means, and control means of the present invention.

The signal acquiring means 802 conducts MR data acquisition according to the aforementioned pulse sequence. At that time, the repetition control section 808 causes the signal acquiring means 802 to conduct the aforementioned repetition of MR data acquisition based on an input signal from the magnetic field disturbance monitoring section 806 to acquire MR data unaffected by magnetic field disturbance. Such MR data are supplied to the image producing section 804. The image producing section 804 conducts image reconstruction based on the MR data.

The effect of corruption of the MR data due to magnetic field disturbance on the reconstructed image decreases for a larger amount of phase encoding. Conversely, a larger amount of phase encoding has greater tolerance to magnetic field disturbance. In light of this property, the threshold for deciding the presence of magnetic field disturbance can be set to a different value for a different amount of phase encoding.

Figure 9:
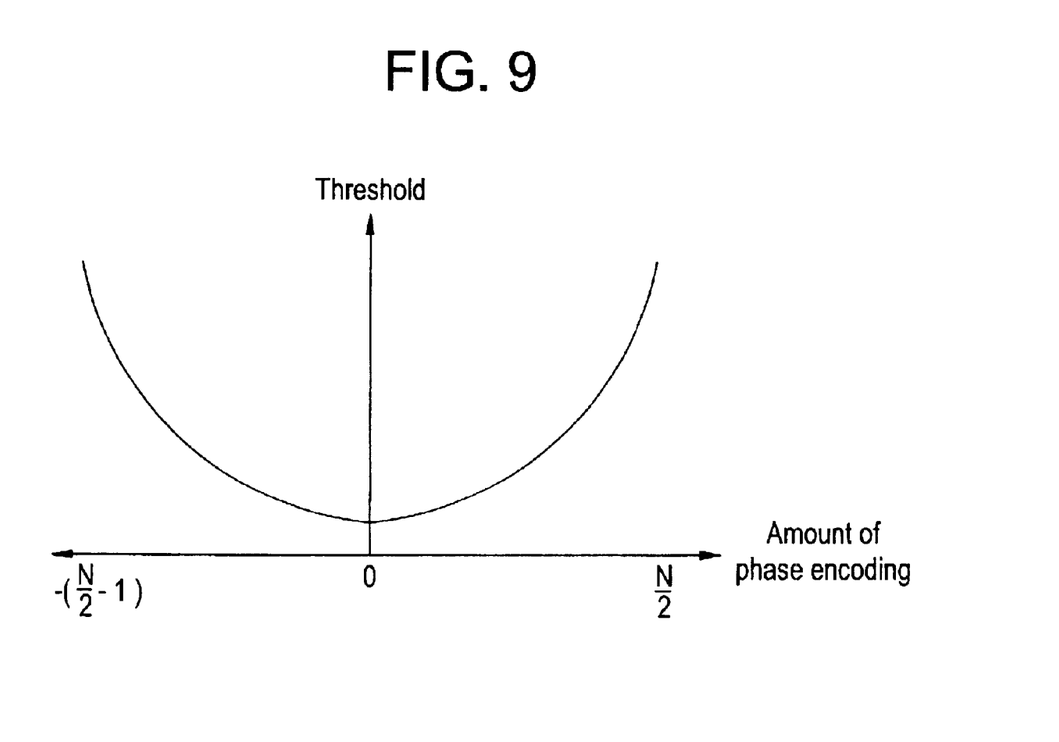
FIG. 9 is a conceptional diagram of threshold setting.

FIG. 9 conceptionally shows such threshold setting. As shown, the smallest threshold is set for an amount of phase encoding of zero, and larger thresholds are set for increasing amounts of phase encoding. The threshold for the amount of phase encoding of zero is, for example, 0.5–1 mG. For the largest amount of phase encoding, a threshold 10–100 times, for example, larger than that for the amount of phase encoding of zero may be set.

According to such threshold setting, when magnetic field disturbance of, for example, 1 mG, is present, repetition of MR data acquisition is needed only if MR data is acquired coincidentally having an amount of phase encoding of zero at that time. Since repetition is not needed for other amounts of phase encoding even if the same magnetic field disturbance is present, the probability of requiring repetition of MR data acquisition is reduced. Therefore, the number of repetitions is significantly reduced as compared with a case in which the threshold is constant regardless of the amount of phase encoding. Thus, reduction in scanning efficiency due to repetition can be minimized.

When a pulse sequence for collecting spin echoes is employed, the threshold may be set to vary with the frequency of the variation of the magnetic field due to disturbance. The effect of magnetic field disturbance on the spin echoes is maximum when the frequency of the variation of the magnetic field is equal to the reciprocal of the echo time TE, i.e., 1/TE, and decreases as the frequency goes away from that frequency.

Figure 10:
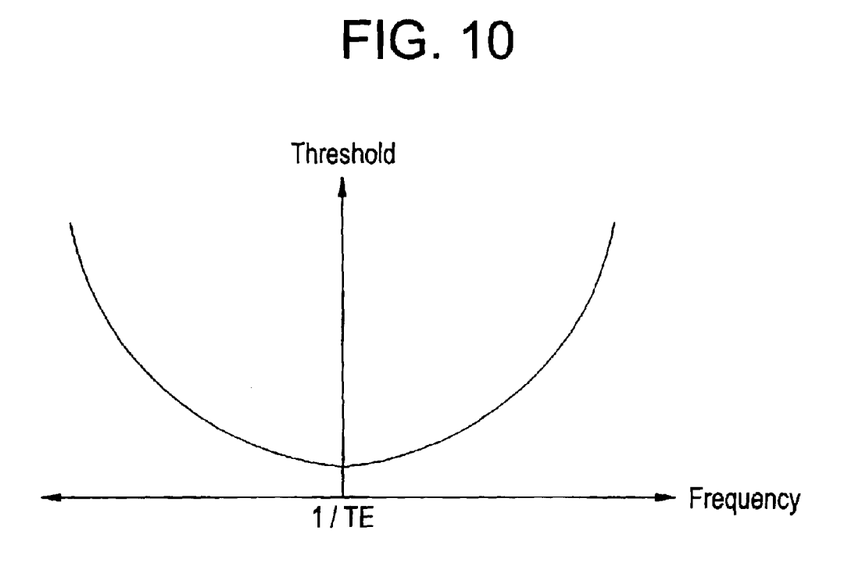
FIG. 10 is a conceptional diagram of threshold setting.

Therefore, as shown in FIG. 10 which is an example, a threshold may be set such that it has the smallest value when the frequency is equal to 1/TE and increases as the frequency goes away from 1/TE. Thus, when spin echoes are being acquired, and when magnetic field disturbance of, for example, 1 mG, is present, repetition of MR data acquisition is needed only if the frequency of the variation of the magnetic field happens to be 1/TE at that time. Since repetition is not needed for other frequencies even if the same magnetic field disturbance is present, the probability of requiring repetition of MR data acquisition is reduced.

Therefore, the number of repetitions is significantly reduced as compared with a case in which the threshold is constant regardless of the amount of phase encoding. Thus, reduction in scanning efficiency due to repetition can be minimized. If such threshold setting is used in combination with the threshold setting shown in FIG. 9, the combined effect of these threshold settings can be obtained to further diminish the reduction in scanning efficiency.

Figure 11:
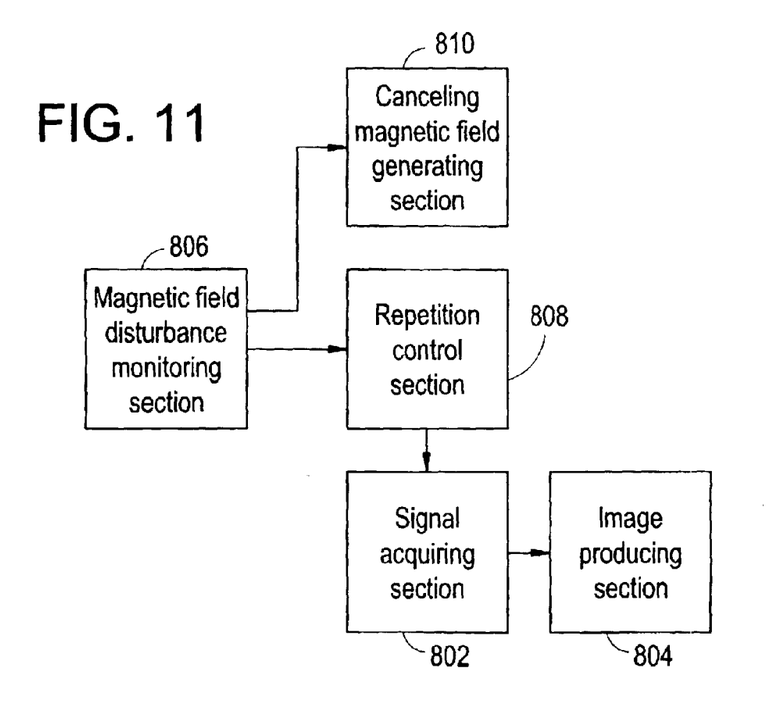
FIG. 11 is a functional block diagram of the apparatus in accordance with one embodiment of the present invention.

Such MR data acquisition may be practiced in a scan room accommodating the magnetic field generating apparatus for canceling magnetic field disturbance, as described earlier in the conventional technique. A functional block diagram of the entire apparatus in this case is shown in FIG. 11. As shown, the apparatus has a configuration shown in the block diagram of FIG. 8 additionally provided with a canceling magnetic field generating section 810.

The canceling magnetic field generating section 810 cancels disturbing magnetic field based on an output signal from the magnetic field disturbance monitoring section 806. This canceling effect reduces apparent magnetic field disturbance, so that the number of repetitions of MR data acquisition is reduced.

Figure 12:
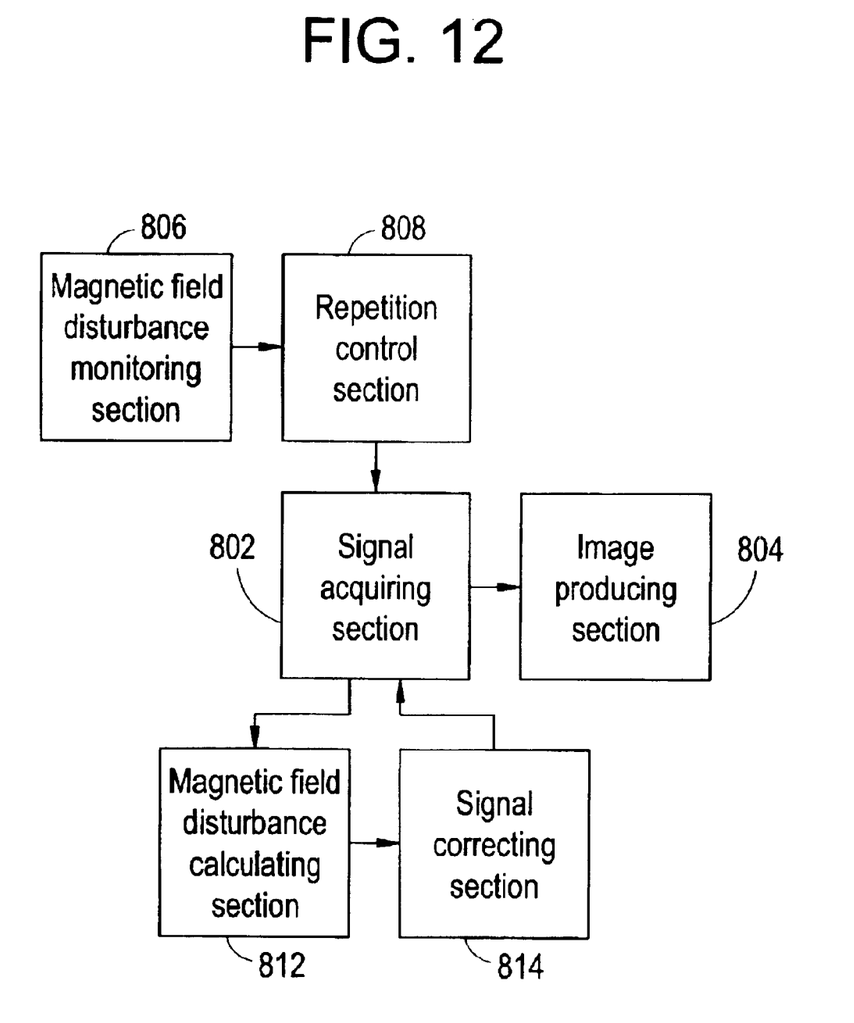
FIG. 12 is a functional block diagram of the apparatus in accordance with one embodiment of the present invention.

On the other hand, the aforementioned MR data acquisition may be conducted in combination with the method that involves arithmetically calculating an effect of magnetic field disturbance, and correcting the magnetic resonance signals corresponding thereto, as described earlier in the conventional technique. A functional block diagram of the entire apparatus in this case is shown in FIG. 12. As shown, the apparatus has a configuration shown in the block diagram of FIG. 8 additionally provided with a magnetic field disturbance calculating section 812 and a signal correcting section 814.

The magnetic field disturbance calculating section 812 calculates magnetic field disturbance based on MR data acquired by the signal acquiring section 802. The signal correcting section 814 corrects MR data acquired by the signal acquiring section based on the calculated value of magnetic field disturbance. In this case, repetition of MR data acquisition is needed only if the magnetic field disturbance is too large to be corrected by the signal correcting section 814, and therefore, the number of repetitions is reduced.

Figure 13:
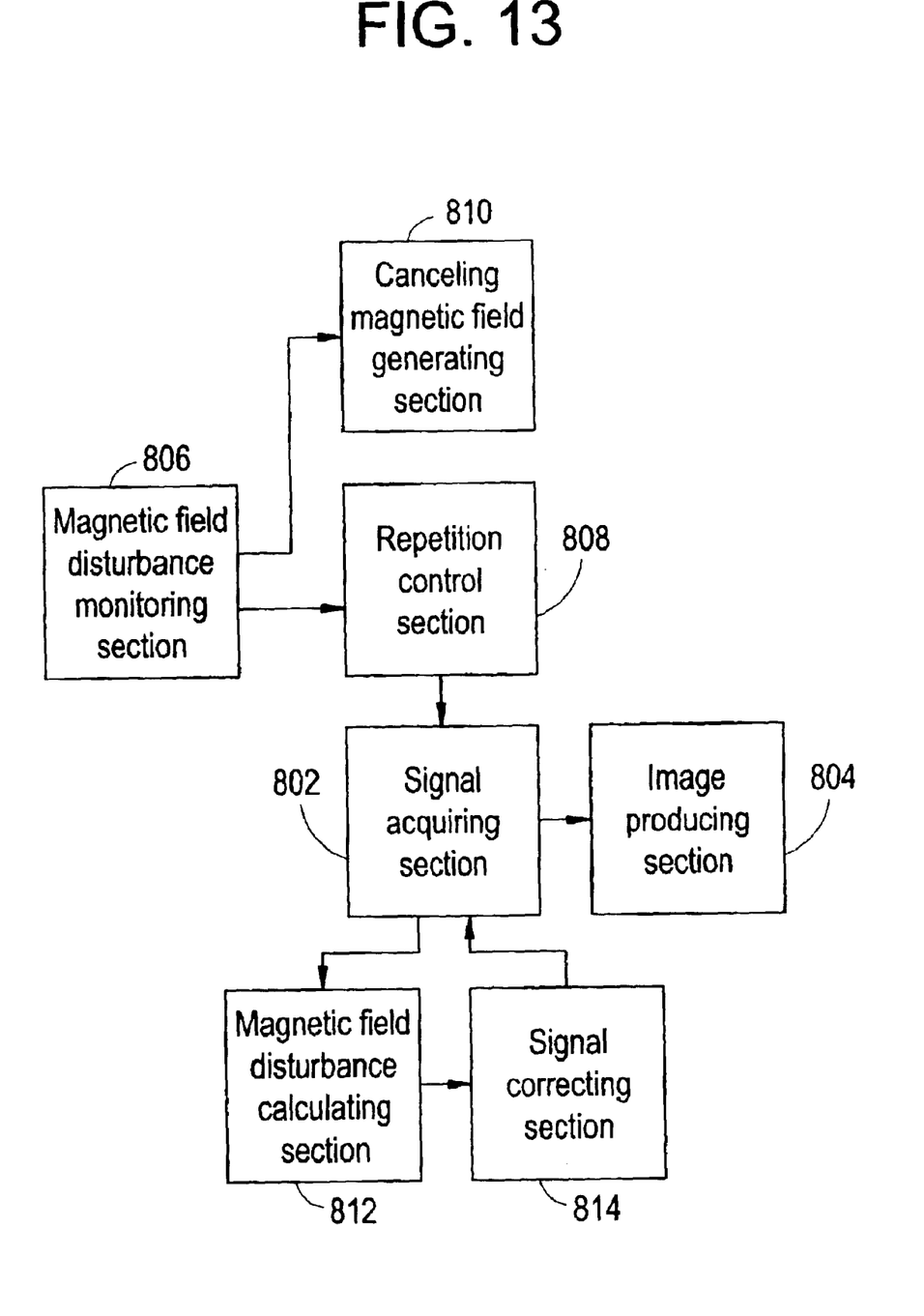
FIG. 13 is a functional block diagram of the apparatus in accordance with one embodiment of the present invention.

This technique may be practiced in a scan room accommodating the magnetic field generating apparatus for canceling magnetic field disturbance. FIG. 13 shows a functional block diagram in this case. Such a configuration can further reduce the number of repetitions by the combined effect of the three techniques.

While the present invention has been described with reference to preferred embodiments hereinabove, various changes or substitutions may be made on these embodiments by those ordinarily skilled in the art pertinent to the present invention without departing from the technical scope of the present invention. Therefore, the technical scope of the present invention encompasses not only those embodiments described above but all that fall within the scope of the appended claims.

Many widely different embodiments of the invention may be configured without departing from the spirit and the scope of the present invention. It should be understood that the present invention is not limited to the specific embodiments described in the specification, except as defined in the appended claims.

What is claimed is:

1. A magnetic resonance signal acquiring apparatus comprising:
   a signal acquiring device for sequentially acquiring magnetic resonance signals for a plurality of views;
   a monitoring device for monitoring magnetic field disturbance in a magnetic field; and
   a control device for causing said signal acquiring device to repeat a magnetic resonance signal acquisition for a view at which the magnetic field disturbance has occurred, wherein said control device causes said signal acquiring device to repeat the magnetic resonance signal acquisition when a variation of the magnetic field exceeds a predefined threshold that is generated based on the magnetic field disturbance created by an inanimate object.

2. The magnetic resonance signal acquiring apparatus of claim 1, wherein said threshold is varied with an amount of phase encoding on said magnetic resonance signals.

3. The magnetic resonance signal acquiring apparatus of claim 1, wherein said threshold is larger for a larger amount of phase encoding.

4. The magnetic resonance signal acquiring apparatus of claim 1, wherein said threshold is varied with a frequency of the variation of said magnetic field.

5. The magnetic resonance signal acquiring apparatus of claim 4, wherein said threshold is larger for a larger difference between said frequency and a reciprocal of an echo time TE of said magnetic resonance signals.

6. A magnetic resonance imaging apparatus comprising:
   a signal acquiring device for sequentially acquiring magnetic resonance signals for a plurality of views;
   a monitoring device for monitoring magnetic field disturbance in a magnetic field;
   a control device for causing said signal acquiring device to repeat a magnetic resonance signal acquisition for a view at which the magnetic field disturbance has occured, wherein said control device causes said signal acquiring device to repeat the magnetic resonance signal acquisition when a variation of the magnetic field exceeds a predefined threshold that is generated based on the magnetic field disturbance created by an inanimate object; and
   an image producing device for producing an image based on signals after said signal acquiring device repeats the magnetic resonance signal acquisition.

7. The magnetic resonance imaging apparatus of claim 6, wherein said threshold is varied with an amount of phase encoding on said magnetic resonance signals.

8. The magnetic resonance imaging apparatus of claim 6, wherein said threshold is larger for a larger amount of phase encoding.

9. The magnetic resonance imaging apparatus of claim 6, wherein said threshold is varied with a frequency of the variation of said magnetic field.

10. The magnetic resonance imaging apparatus of claim 9, wherein said threshold is larger for a larger difference between said frequency and a reciprocal of an echo time TE of said magnetic resonance signals.

11. The magnetic resonance signal acquiring apparatus of claim 1, wherein said inanimate object comprises a vehicle.

* * * * *

UNITED STATES PATENT AND TRADEMARK OFFICE
CERTIFICATE OF CORRECTION

| | |
|---|---|
| PATENT NO. | : 6,927,576 B2 |
| APPLICATION NO. | : 10/376760 |
| DATED | : August 9, 2005 |
| INVENTOR(S) | : Hoshino |

It is certified that error appears in the above-identified patent and that said Letters Patent is hereby corrected as shown below:

In Claim 6, column 12, line 11, delete "occured" and insert therefor -- occurred --.

Signed and Sealed this

Sixth Day of November, 2007

JON W. DUDAS
*Director of the United States Patent and Trademark Office*